United States Patent
Anderson et al.

(10) Patent No.: US 11,943,381 B2
(45) Date of Patent: *Mar. 26, 2024

(54) HANDHELD DEVICE CASE WITH ACTIVATABLE SHIELD TO BLOCK WIRELESS SIGNALS

(71) Applicant: OSOM Products, Inc., Cupertino, CA (US)

(72) Inventors: Gary Anderson, San Mateo, IL (US); Jason Sean Gagne-Keats, Cupertino, CA (US); David John Evans, V, Portola Valley, CA (US)

(73) Assignee: OSOM PRODUCTS, INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/315,302

(22) Filed: May 10, 2023

(65) Prior Publication Data
US 2023/0283703 A1 Sep. 7, 2023

Related U.S. Application Data

(63) Continuation of application No. 18/046,841, filed on Oct. 14, 2022, now Pat. No. 11,706,326, which is a continuation of application No. 17/660,989, filed on Apr. 27, 2022, now Pat. No. 11,563,839.

(60) Provisional application No. 63/180,572, filed on Apr. 27, 2021.

(51) Int. Cl.
*H04M 1/19* (2006.01)
*A45C 11/00* (2006.01)
*H05K 9/00* (2006.01)

(52) U.S. Cl.
CPC ............... *H04M 1/19* (2013.01); *A45C 11/00* (2013.01); *H05K 9/002* (2013.01); *A45C 2011/002* (2013.01)

(58) Field of Classification Search
CPC .... H04M 1/19; A45C 11/00; A45C 2011/002; H05K 9/002
See application file for complete search history.

(56) References Cited

U.S. PATENT DOCUMENTS

| | | | | |
|---|---|---|---|---|
| 3,347,003 A | * | 10/1967 | Lapp | H01Q 1/08 52/110 |
| 6,411,831 B1 | * | 6/2002 | Oshimi | H01Q 1/242 455/575.5 |
| 6,870,517 B1 | * | 3/2005 | Anderson | H01Q 19/32 343/702 |

(Continued)

*Primary Examiner* — Lewis G West
(74) *Attorney, Agent, or Firm* — Perkins Coie LLP; Alberto Araiza; Lena Petrovic (57) ABSTRACT

A technique for selectively configuring a case of a handheld device to shield an antenna from receiving or transmitting wireless signals is disclosed. The technique includes moving a blocking element on the case between a first position and a second position. The blocking element is a physical structure that is rotatable, slidable, or removable to switch between the first position and the second position. In response to moving the blocking element to the first position, the blocking element blocks wireless signals received or transmitted by the antenna of the handheld device. In response to moving the blocking element to the second position, wireless signals can be received or transmitted through the case by the antenna.

20 Claims, 4 Drawing Sheets

(56) References Cited

U.S. PATENT DOCUMENTS

| | | | | |
|---|---|---|---|---|
| 7,375,631 B2* | 5/2008 | Moskowitz | ............ | H01Q 1/526 257/679 |
| 9,002,288 B1* | 4/2015 | Reible | ............. | G06K 19/07327 455/575.8 |
| 9,705,183 B2* | 7/2017 | Nikitin | ................... | H01Q 1/245 |
| 9,755,682 B2* | 9/2017 | Byler | ....................... | H04B 1/38 |
| 9,949,218 B1* | 4/2018 | Lau | ................... | H04M 1/72409 |
| 10,090,594 B2* | 10/2018 | Henry | ................ | H01Q 13/106 |
| 10,516,431 B2 | 12/2019 | Dilella | | |
| 11,329,685 B2* | 5/2022 | Bickley | ................... | H01Q 1/422 |
| 2004/0160369 A1* | 8/2004 | Wong | ..................... | H05K 9/002 343/702 |
| 2005/0208931 A1* | 9/2005 | Hoffman | ............. | H04M 1/7385 455/417 |
| 2005/0237295 A1* | 10/2005 | Anderson | ........... | G06F 3/03545 340/572.1 |
| 2007/0237348 A1* | 10/2007 | Phillips | ................ | H04R 1/086 381/189 |
| 2007/0273665 A1* | 11/2007 | Park | ................... | G06F 3/04883 345/173 |
| 2009/0045960 A1* | 2/2009 | von Gutfeld | ......... | G07F 7/0866 340/572.3 |
| 2010/0240421 A1* | 9/2010 | Sekora | ................ | H04B 1/3838 455/575.1 |
| 2011/0199276 A1* | 8/2011 | Gruzberg | ............... | H01Q 1/245 343/841 |
| 2011/0294553 A1* | 12/2011 | Patil | ..................... | H05K 9/0024 455/571 |
| 2013/0206470 A1* | 8/2013 | Davis | .................... | H01R 13/72 439/502 |
| 2013/0206844 A1* | 8/2013 | Chen | .................. | H04M 1/0254 235/492 |
| 2014/0141727 A1* | 5/2014 | Kildal | ................... | G01R 29/105 455/67.12 |
| 2014/0159980 A1 | 6/2014 | Finegold | | |
| 2014/0251368 A1* | 9/2014 | Lawson | ................ | A45C 13/02 206/37 |
| 2014/0266927 A1* | 9/2014 | Qi | .......................... | H01Q 1/243 343/702 |
| 2016/0088912 A1* | 3/2016 | Lawson | ................ | A45D 33/26 206/38 |
| 2016/0212893 A1* | 7/2016 | Byler | .................... | G06F 1/1626 |
| 2016/0255459 A1* | 9/2016 | Sarkar | ................... | H04W 12/04 455/41.1 |
| 2017/0064882 A1* | 3/2017 | Davis | .................. | H04B 1/3888 |
| 2017/0318712 A1* | 11/2017 | Byler | .................... | G06F 1/1626 |
| 2018/0294871 A1* | 10/2018 | Kosseifi | ................ | H04W 4/026 |
| 2019/0235120 A1* | 8/2019 | Ng | .......................... | G01V 3/28 |
| 2020/0358468 A1* | 11/2020 | Scott | ..................... | A45C 11/00 |
| 2022/0034084 A1* | 2/2022 | Lefkus | .................. | F41H 5/24 |
| 2022/0205104 A1* | 6/2022 | Rimmer | .................. | C23C 16/52 |

* cited by examiner

HANDHELD DEVICE CASE WITH ACTIVATABLE SHIELD TO BLOCK WIRELESS SIGNALS

CROSS-REFERENCE TO RELATED APPLICATIONS

This application is a continuation of U.S. patent application Ser. No. 18/046,841, filed Oct. 14, 2022, entitled "HANDHELD DEVICE CASE WITH ACTIVATABLE SHIELD TO BLOCK WIRELESS SIGNALS," which is a continuation of U.S. patent application Ser. No. 17/660,989, filed Apr. 27, 2022, which claims the benefit of U.S. Provisional Patent Application No. 63/180,572, titled "Faraday Phone Case," and filed Apr. 27, 2021. The aforementioned applications are incorporated herein by reference in their entirety.

TECHNICAL FIELD

The present disclosure generally relates to controlling wireless signals received or transmitted by handheld devices.

BACKGROUND

Mobile computing devices such as smartphones, tablets, and smart watches are increasingly ubiquitous. These devices have the ability to place and receive voice/video calls and create and receive text messages, make payments, have personal digital assistants, an event calendar, a media player, video games, GPS navigation, digital cameras, etc. As wireless communications and computer technologies continue to improve, this trend will only accelerate.

However, the increased use and capability of mobile devices has also raised new issues surrounding personal privacy. Mobile devices generate a large amount of data regarding their users, which can be used to predict behavior, target advertisements, etc. In addition, malicious actors can track a user's location, steal passwords and credit card information, and remotely activate a device's webcam. But because of how essential mobile devices are in everyday life, a user cannot simply stop using them. Thus, a convenient way to protect against the unconsented collection of user data is needed.

BRIEF DESCRIPTION OF THE DRAWINGS

Detailed descriptions of implementations of the present technology will be described and explained through the use of the accompanying drawings.

DETAILED DESCRIPTION

The embodiments set forth below represent the necessary information to enable those skilled in the art to practice the embodiments and illustrate the best mode of practicing these embodiments. Upon reading the following description in light of the accompanying figures, those skilled in the art will understand the concepts of the disclosure and will recognize applications of these concepts that are not particularly addressed herein. It should be understood that these concepts and applications fall within the scope of the disclosure and the accompanying claims.

The purpose of the terminology used here is only for describing embodiments and is not intended to limit the scope of the disclosure. Where context permits, words using the singular or plural form may also include the plural or singular form, respectively.

As used herein, unless specifically stated otherwise, terms such as "processing," "computing," "calculating," "determining," "displaying," "generating" or the like, refer to actions and processes of a computer or similar electronic computing device that manipulates and transforms data represented as physical (electronic) quantities within the computer's memory or registers into other data similarly represented as physical quantities within the computer's memory, registers, or other such storage medium, transmission, or display devices.

As used herein, the terms "connected," "coupled," or variants thereof, refer to any connection or coupling, either direct or indirect, between two or more elements. The coupling or connection between the elements can be physical, logical, or a combination thereof.

Figure 1:
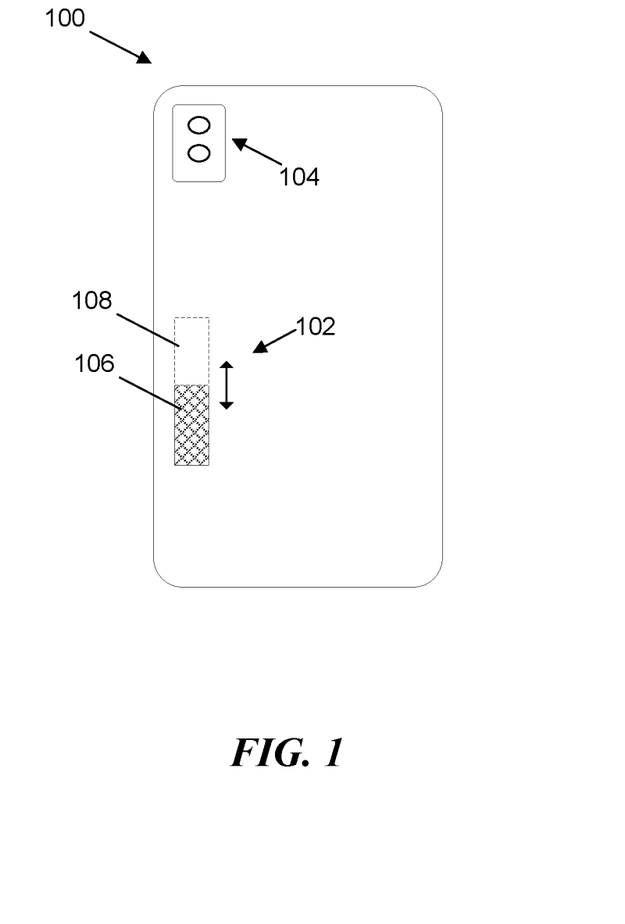
FIG. 1 illustrates a case for a handheld device including a switch to activate a shield that blocks wireless signals.

As used herein, the term "substantially" can refer to a majority or near an entirety. For example, "substantially blocking" wireless signals of an antenna can indicate that more wireless signals are blocked from being received or transmitted compared to the total amount of wireless signals that could be received or transmitted. In another example, "substantially blocking" wireless signals could mean that all or nearly all wireless signals are blocked to/from an antenna.
Configurable Case for Blocking Wireless Signals FIG. 1 illustrates an example of a case 100 for a handheld device (e.g., smartphone). The case 100 can correspond to the enclosure or exterior of the handheld device (e.g., part of the handheld device) or a separate structure that is used to cover the handheld device. That is, the case is secured over the exterior of the handheld device. The case 100 can include a protective housing that holds a smartphone or other handheld device and protects the device against physical damage. The protective housing can be substantially made of plastic, rubber, silicone, leather, etc. The protective housing can enclose one or more sides of the smartphone (e.g., 4 or 5 sides). As shown, the case 100 having the protective housing covers at least the backside of the device. A portion for a rear camera 104 of the device can be transparent, or the protective housing can include an opening at a portion that exposes the rear camera.

The case 100 includes a switch 102 that can toggle between different states to block or unblock passage of wireless signals to/from an antenna of the wireless device through the case 100. A first state of the switch 102 activates the signal blocking function and a second state deactivates the signal blocking function of the case 100. In another example, the switch 102 is slidable to control an amount of signals being blocked to/from an antenna. For example, positioning the switch in an intermediary position between the first and second state can attenuate but not block signal propagation to/from the antenna.

The switch 102 controls a blocking element, which is a physical structure incorporated in the case 100. In the illustrated example, a portion of the switch 102 includes the blocking element 106. The blocking element 106 can physically cover one or more antennas of a handheld device disposed in the case 100 to shield wireless signals transmitted from and received by antennas of the handheld device. The blocking element 106 can comprise one or more layers of conductive wire mesh, as shown in FIG. 1. In some embodiments, the blocking element 106 can also be or include a sheet of conductive material, such as a solid or perforated sheet. The blocking element 106 can be comprised of aluminum, copper, silver, or any suitable electrical conductor or other material that can shield wireless signals from propagating through the blocking element 106. The blocking element 106 can be configured to shield against a wireless signal depending on the frequency, power, and wave form of that signal. For example, a thicker blocking portion can attenuate stronger signals than a thinner conductor. For a mesh, a smaller mesh size can shield higher frequency signals compared to a larger mesh size.

In the illustrated example, the switch 102 includes a sliding element 108 coupled to the blocking element 106. The sliding element 108 can be moved between a first position and a second position, as shown in FIG. 1. When the sliding element 108 is in the first position, the blocking element 106 blocks wireless signals, and when the sliding element 108 is in the second position, the antenna of the handheld device can receive or transmit wireless signals through the portion of the case 100 that is otherwise covered by the blocking element 106. For example, the blocking element 106 can be integrated into the sliding element 108 and cover the antenna of a wireless mobile device when the sliding element 108 is in the first position, while the blocking element 106 does not cover the antenna when the sliding element 108 is in the second position. In another example, the blocking element 106 can comprise a stationary first portion and a movable second portion coupled to the sliding element 108. The first and second portions can be coupled when the sliding element 108 is in the first position, forming a Faraday shield. When the sliding element 108 is moved to the second position, the Faraday shield can be severed, allowing wireless signals to travel through the case 100. For example, the first and second portions can overlap to form a wire mesh. In some embodiments, the sliding element 108 can be replaced with a folding element, a removable element, a rotatable element, or other mechanism that can move and/or sever the Faraday cage. For example, a rotatable element can rotate in one direction to cover an antenna and rotate back in the other direction to uncover the antenna.

In some embodiments, the case 100 can include multiple blocking portions, switches, or sliding elements for multiple antennas of a handheld device. For example, a smartphone can include anywhere from four to thirteen different antennas. There are typically at least four radios (transmitters and/or receivers) in smartphones including cellular, Wi-Fi, Bluetooth, and GPS radios. The antennas can have different shapes and sizes, and can be distributed in various locations of a smartphone. Thus, embodiments include blocking elements for each antenna or multiple antennas. The blocking elements can be collectively or independently controlled to block wireless signals for selected or all antennas of radios on the wireless device.

Figure 2:
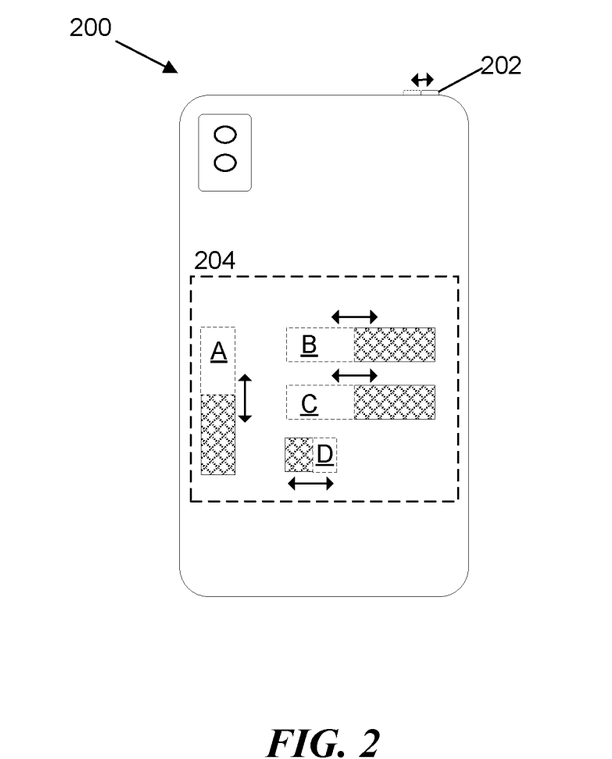
FIG. 2 illustrates a system on a case for a handheld device including a switch to activate a shield that blocks wireless signals.

FIG. 2 illustrates a configurable blocking system for a case 200 of a handheld device. As shown, the case 200 optionally includes a switch 202 to activate/deactivate one or more shields that block wireless signals to/from one or more antennas of a handheld device. The case 200 includes a system of blocking elements 204-A through 204-D (collectively referred to herein as "blocking elements 204" and individually as "blocking element 204") that cover at least one or more portions of the antenna(s) of a handheld device held by the case 200. Each of the blocking elements 204 can shield wireless signals transmitted to/from one or more antennas of the handheld device. The blocking elements 204 can comprise a similar or different structure or composition of the blocking element 106 described with respect to FIG. 1.

The switch 202 can be actuated (e.g., clicked, rotated, tapped) to configure the blocking elements 204 to block or allow wireless signal propagation to/from the antennas of the handheld device. The switch 202 is illustrated as a hardware component such as a mechanical switch. However, embodiments of a switch include software controls running on the handheld device that can be actuated to configure the blocking elements 204. The blocking elements 204 can be physical components embedded anywhere in-between an antenna and an exterior environment where wireless signals propagate. The blocking elements 204 are preferably at least partially visible to a user looking at the case 200, so that the user can visually verify when a blocking function is engaged. Otherwise, a user would have to trust that wireless signals are being blocked, which is undesirable because the handheld device could be hacked and erroneously indicate that a blocking function is engaged. In one example, a user of the handheld device can interact through an interface with a software program or module running on the smartphone to selectively activate or deactivate all or some of the blocking elements 204.

A user can thus configure each blocking element 204, which can be used to set levels for blocking wireless signals or block wireless signals for different radios of the handheld device (e.g., Bluetooth, cellular, Wi-Fi). For example, the user can select to block wireless signals for Bluetooth communications but not for cellular communications. In another example, activating/deactivating certain blocking elements 204 block a frequency, power, and wave form of certain wireless signals. For example, the blocking element 204-A can be actuated to block a first frequency and the blocking element 204-B can be actuated to block a second frequency different from the first frequency. The blocking elements 204 can thus be electrically (e.g., battery powered) or mechanically configured (e.g., physically moved) to activate or deactivate signal blocking functions.

Figure 3:
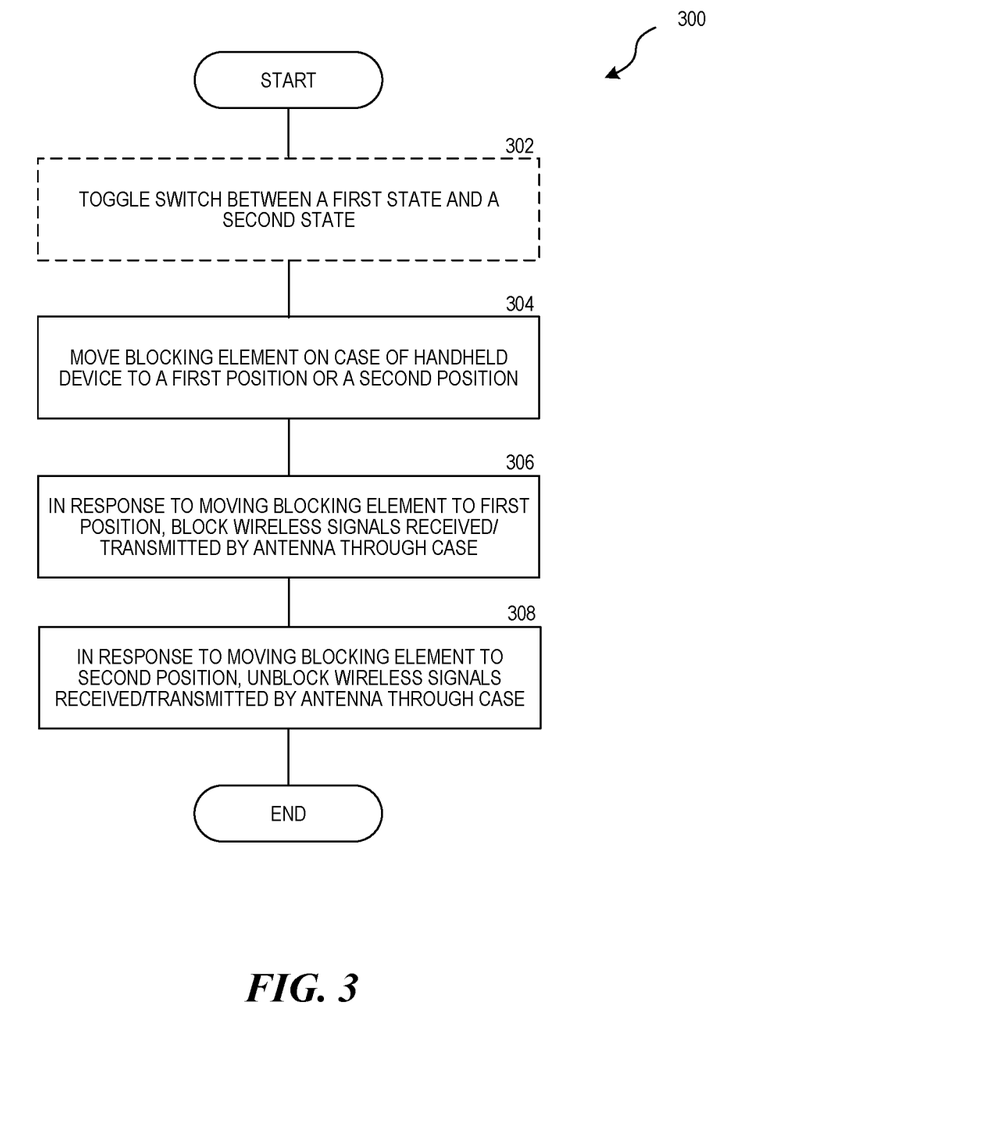
FIG. 3 illustrates a method for selectively configuring a case of a handheld device to shield an antenna from receiving or transmitting wireless signals.

FIG. 3 illustrates a method 300 for selectively configuring a case of a handheld device to shield an antenna from receiving or transmitting wireless signals. The case includes a housing configured to physically protect the handheld device, movable elements configured to move to different positions and blocking elements coupled to the movable elements. Each blocking element is configured to block or unblock propagation of wireless signals to/from an antenna of the handheld device. The blocking element is disposed in the case between the antenna and an exterior environment. Further, any blocking element is at least partially visible from the exterior environment. In one example, the case is integral to the handheld device to form an exterior surface of the handheld device. In another example, the case is removable from the handheld device and physically protects the handheld device when the handheld device is disposed in the case.

At 302, a switch is toggled between two states. Toggling the switch to a first state can cause a blocking element to move to a first position. Toggling the switch to a second state can cause the blocking element to move to a second position. In one example, the switch can control multiple blocking elements to simultaneously switch between blocking and unblocking wireless signals. In another example, multiple switches each include a blocking element configured to switch between blocking and unblocking wireless signals. In another example, multiple blocking elements are each independently configurable through a software program to independently switch between states to block and unblock wireless signals to/from the antenna.

At 304, the blocking element on the case of the handheld device is moved to a first position or a second position. The blocking element is a physical structure that is rotatable, slidable, or removable between the first position and the second position. In one example, the movable element is movable in response to actuation of a graphic control displayed on a display screen of the handheld device. In another example, the blocking element is movable across a range of positions to block a corresponding range of frequencies, power, or waveforms of wireless signals.

At 306, in response to moving the blocking element to a first position, propagation of wireless signals received or transmitted by the antenna through the case is blocked. At 308, in response to moving the blocking element to the second position, propagation of wireless signals received or transmitted by the antenna through the case is unblocked. For example, a movable element at the first position covers at least a portion of the antenna to block a radio frequency (RF) radiation to/from the antenna, and the movable element at the second position uncovers the at least the portion of the antenna to unblock RF radiation to/from the antenna.

In another example, an additional blocking element is moved between different positions to block or unblock propagation signals through the case of the handheld device to the antenna. The different blocking elements can be collectively or independently operable. In one example, the different antennas are coupled to different radio devices including cellular, Wi-Fi, Bluetooth, or GPS radio devices. As such, a user can selectively block different types of communications signals.

Handheld Device

Figure 4:
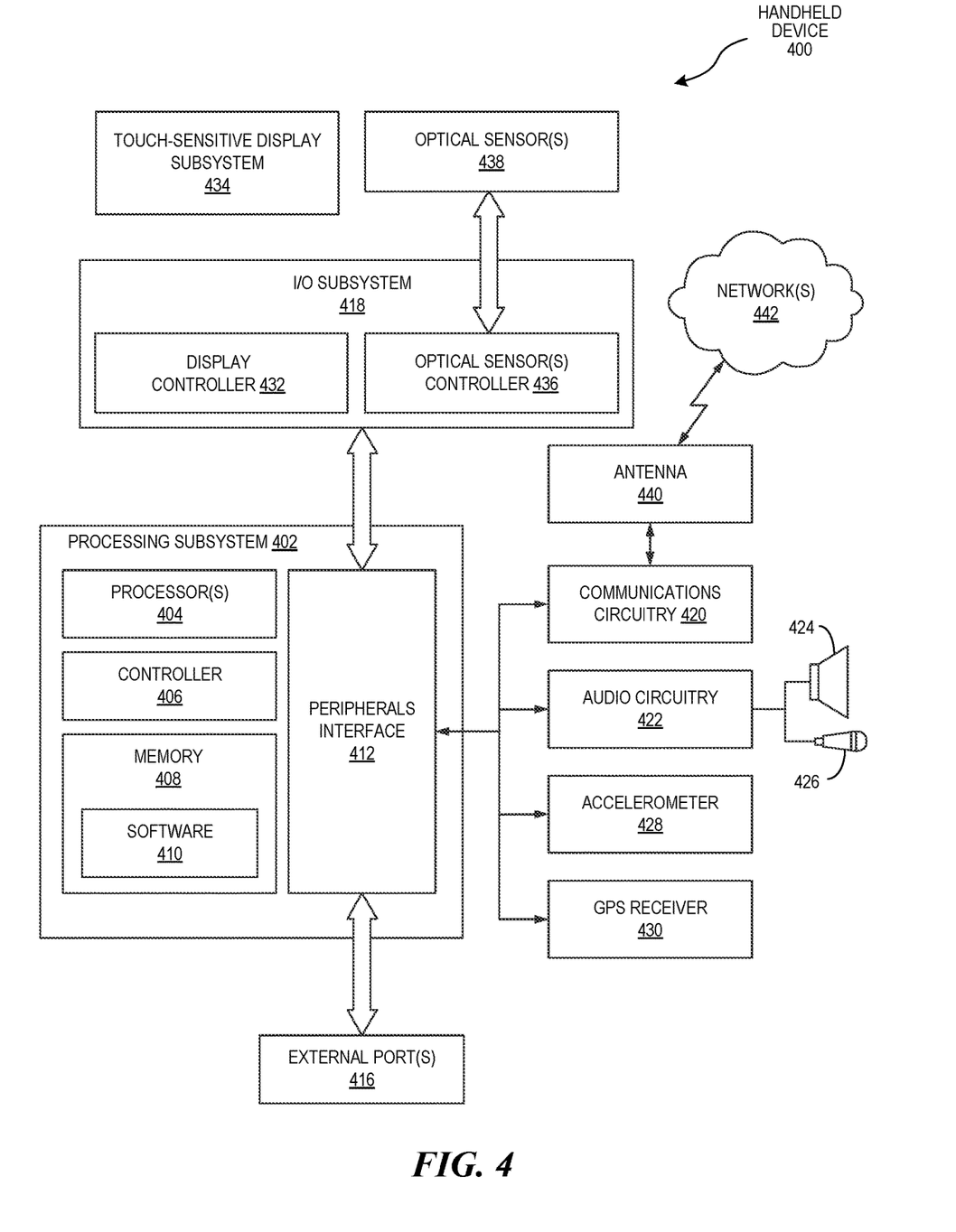
FIG. 4 is a block diagram illustrating an example computing device in which aspects of the disclosed technology can be embodied.

FIG. 4 is a block diagram illustrating an example handheld device in which aspects of the disclosed technology can be embodied. For example, the handheld device 400 can be placed in the case 100 of FIG. 1. The handheld device 400 may include generic components and/or components specifically designed to carry out the disclosed technology. The handheld device 400 may be a standalone device or part of a distributed system that spans networks, locations, machines, or combinations thereof. For example, components of the handheld device 400 may be included in or coupled to a system-on-chip (SOC), a single-board computer (SBC) system, a desktop or laptop computer, a kiosk, a mainframe, a mesh of computer systems, or combinations thereof.

In some embodiments, the handheld device 400 can operate as a server device or a client device in a client-server network environment, or as a peer machine in a peer-to-peer system. In some embodiments, the handheld device 400 may perform one or more steps of the disclosed embodiments in real-time, near real-time, offline, by batch processing, or combinations thereof.

The handheld device 400 includes a processing subsystem 402 that includes one or more processors 404 (e.g., Central Processing Units (CPUs), Application Specific Integrated Circuits (ASICs), and/or Field Programmable Gate Arrays (FPGAs)), a memory controller 406, memory 408 that can store software 410, and a peripherals interface 412. The memory 408 may include volatile memory (e.g., random-access memory (RAM)) and/or non-volatile memory (e.g., read-only memory (ROM)). The memory 408 can be local, remote, or distributed. The handheld device 400 can also include a clock subsystem 414 that controls a timer for use in some embodiments. The components of the handheld device 400 are interconnected over a bus (not shown) operable to transfer data between hardware components.

The peripherals interface 412 is coupled to one or more external ports 416, which can connect to an external power source, for example. The peripherals interface 412 is also coupled to an I/O subsystem 418. Other components coupled to the peripherals interface 412 include communications circuitry 420, audio circuitry 422 for a speaker 424 and a microphone 426, an accelerometer 428, a GPS receiver 430 (or Global Navigation Satellite System (GLONASS) or other global navigation system receiver), and other sensors (not shown). The GPS receiver 430 is operable to receive signals concerning the geographic location of the handheld device 400. The accelerometer 428 can be operable to obtain information concerning the orientation (e.g., portrait or landscape) of handheld device 400.

The I/O subsystem 418 includes a display controller 432 operative to control a touch-sensitive display system 434, which further includes the touch-sensitive display of the handheld device 400. The I/O subsystem 418 also includes an optical sensor(s) controller 436 for one or more optical sensors 438 of the handheld device 400. The I/O subsystem 418 includes other components (not shown) to control physical buttons such a "home" button.

The communications circuitry 420 can configure the antenna 440 of the handheld device. In some embodiments, the antenna 440 is structurally integrated with the handheld device 400 (e.g., embedded in the housing or display screen) or coupled to the handheld device 400 through the external ports 416. The communications circuitry 420 can convert electrical signals to/from electromagnetic signals that are communicated by the antenna 440 to networks 442 or other devices. For example, the communications circuitry 420 can include radio frequency (RF) circuitry that processes RF signals communicated by the antenna 440.

The communications circuitry 420 can include circuitry for performing well-known functions such as an RF transceiver, one or more amplifiers, a tuner, oscillators, a digital signal processor, a CODEC chipset, a subscriber identity module (SIM card or eSIM), and so forth. The communications circuitry 420 may communicate wirelessly via the antenna elements with the networks 14 (e.g., the Internet, an intranet and/or a wireless network, such as a cellular network, a wireless local area network (LAN) and/or a metropolitan area network (MAN)) or other devices.

The software 410 can include an operating system (OS) software program, application software programs, and/or modules such as a communications module, a GPS module, and the like. For example, the GPS module can estimate the location of the handheld device 400 based on the GPS signals received by the GPS receiver 430. The GPS module can provide this information to components of the handheld device 400 for use in various applications (e.g., to provide location-based access to service providers).

A software program, when referred to as "implemented in a computer-readable storage medium," includes computer-readable instructions stored in the memory (e.g., memory 408). A processor (e.g., processor 404) is "configured to execute a software program" when at least one value associated with the software program is stored in a register that is readable by the processor. In some embodiments, routines executed to implement the disclosed embodiments may be implemented as part of OS software (e.g., MICROSOFT WINDOWS and LINUX) or a specific software application, component, program, object, module, or sequence of instructions referred to as "computer programs."

Computer programs typically comprise one or more instructions set at various times in various memory devices of a computing device (e.g., handheld device 400), which, when read and executed by at least one processor (e.g., processor 404), will cause the handheld device 400 to execute functions involving the disclosed embodiments. In some embodiments, a carrier containing the aforementioned computer program product is provided. The carrier is one of an electronic signal, an optical signal, a radio signal, or a non-transitory computer-readable storage medium (e.g., the memory 408).

Operation of a memory device (e.g., memory 38), such as a change in state from a binary one (1) to a binary zero (0) (or vice versa) may comprise a visually perceptible physical change or transformation. The transformation may comprise a physical transformation of an article to a different state or thing. For example, a change in state may involve accumulation and storage of charge or a release of stored charge. Likewise, a change of state may comprise a physical change or transformation in magnetic orientation or a physical change or transformation in molecular structure, such as a change from crystalline to amorphous or vice versa.

The handheld device 400 can be any type of electronic device that can communicate wirelessly with a network node and/or with another handheld device in a cellular, computer, and/or mobile communications system. Examples of a handheld device include smartphones (e.g., APPLE IPHONE, SAMSUNG GALAXY, NOKIA LUMINA), tablet computers (e.g., APPLE IPAD, SAMSUNG NOTE, AMAZON FIRE, MICROSOFT SURFACE), wireless devices capable of machine-to-machine (M2M) communication, wearable electronic devices, and any other handheld device that is capable of accessing the networks 442.

The handheld device 400 may store and transmit (e.g., internally and/or with other electronic devices over a network) code (composed of software instructions) and data using machine-readable media, such as non-transitory machine-readable media (e.g., machine-readable storage media such as magnetic disks, optical disks, read only memory (ROM), flash memory devices, and phase change memory) and transitory machine-readable transmission media (e.g., electrical, optical, acoustical, or other forms of propagated signals, such as carrier waves or infrared signals).

The handheld device 400 can include hardware such as one or more processors coupled to one or more other components, such as non-transitory machine-readable media to store code and/or data, user input/output (I/O) devices (e.g., a keyboard, a touchscreen, and/or a display), and network connections (e.g., an antenna) to transmit code and/or data using propagating signals. The coupling of the processor(s) and other components is typically through one or more busses and bridges (also referred to as bus controllers). Thus, a non-transitory machine-readable medium of a given electronic device typically stores instructions for execution on processor(s) of that electronic device. One or more parts of an embodiment of the present disclosure may be implemented using different combinations of software, firmware, and/or hardware.

The network(s) 442 may include any combination of private, public, wired, or wireless systems such as a cellular telephone network, a computer network, the Internet, and the like. Any data communicated over the network(s) 442 may be encrypted or unencrypted at various locations or along different portions of the networks. Examples of wireless systems include Wideband Code Division Multiple Access (WCDMA), High Speed Packet Access (HSPA), WiMax, Wi-Fi, Wireless Local Area Network (WLAN), and Global System for Mobile Communications (GSM), GSM Enhanced Data Rates for Global Evolution (EDGE) Radio Access Network (GERAN), and other systems that may also benefit from exploiting the scope of this disclosure.

The handheld device 400 may use a variety of communications standards, protocols, number of frequency bands, frequencies, and technologies, including but not limited to Global System for Mobile Communications (GSM), Enhanced Data GSM Environment (EDGE), high-speed downlink packet access (HSDPA), wideband code division multiple access (W-CDMA), code division multiple access (CDMA), time division multiple access (TDMA), 3rd Generation Partnership Project (3GPP) related standards, BLUETOOTH, Wireless Fidelity (Wi-Fi) (e.g., IEEE 802.11a, 802.11b, 802.11g, 802.11n, 802.11ad, 802.11ay), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed.

Aspects of the disclosed embodiments may be described in terms of algorithms and symbolic representations of operations on data bits stored in memory. These algorithmic descriptions and symbolic representations generally include a sequence of operations leading to a desired result. The operations require physical manipulations of physical quantities. Usually, though not necessarily, these quantities take the form of electric or magnetic signals that are capable of being stored, transferred, combined, compared, and otherwise manipulated. Customarily, and for convenience, these signals are referred to as bits, values, elements, symbols, characters, terms, numbers, or the like. These and similar terms are associated with physical quantities and are merely convenient labels applied to these quantities.

The handheld device 400 may include other components that are not shown nor further discussed herein for the sake of brevity. One having ordinary skill in the art will understand any hardware and software that is included but not shown in FIG. 2. While embodiments have been described in the context of fully functioning handheld devices, those skilled in the art will appreciate that the various embodiments are capable of being distributed as a program product in a variety of forms and that the disclosure applies equally, regardless of the particular type of machine or computer-readable media used to actually effect the embodiments.

The invention claimed is:

1. A mobile device comprising a user display and at least one processor configured to:
   display a graphic control on the user display configured to move a movable element between a first position and a second position, and wherein a blocking element coupled to the movable element is configured to:
     block propagation of a first protocol of wireless signal and allow propagation of a second protocol of wireless signal at an antenna of the mobile device when the movable element is in the first position; and
     allow propagation of the first protocol of wireless signal and block propagation of the second protocol of wireless signal at the antenna when the movable element is in the second position;

receive a user interaction for actuating the graphic control via the user display; and in response to actuation of the graphic control, cause the movable element to move between the first position and the second position.

2. The mobile device of claim 1, wherein the first protocol of wireless signal corresponds to a first range of wireless signal frequency, power, or waveform, and wherein the second protocol of wireless signal corresponds to a second range of wireless signal frequency, power, or waveform.

3. The mobile device of claim 1, wherein the movable element comprises software controls executed by the at least one processor that can be actuated to configure the blocking element.

4. The mobile device of claim 1, wherein the movable element and the blocking element coupled to the movable element are disposed in a case for the mobile device, and wherein the case is configured to be removable from the mobile device and to physically protect the mobile device when the mobile device is disposed in the case.

5. The mobile device of claim 1, wherein the movable element and blocking element coupled to the movable element are disposed in a case of the mobile device, and wherein the case is integrated in the mobile device and forms a surface of the mobile device.

6. The mobile device of claim 1, wherein the movable element is a physical structure that is rotatable, slidable, or removable between the first position and the second position and comprises: a sliding element, a folding element, a removable element, and/or a rotatable element.

7. The mobile device of claim 1, wherein the at least one processor is further configured to:

display a plurality of graphic controls on the user display, wherein each of the plurality of graphic controls is configured to move one of a plurality of movable elements configured to actuate one or more blocking elements to block propagation of different wireless signals.

8. The mobile device of claim 1, wherein the blocking element is configured to be electrically or mechanically configured to move between the first position and second position.

9. The mobile device of claim 1, wherein the mobile device further comprises one or more antennas for receiving or transmitting wireless signals.

10. The mobile device of claim 9, wherein the blocking element is disposed in a case between at least one antenna of the one or more antennas and an exterior environment, and wherein the blocking element is configured to block or unblock propagation of wireless signals to and/or from the at least one antenna of the mobile device.

11. A method for configuring a case of a handheld device to block wireless signals at an antenna, the method comprising:

displaying, on a user display of a mobile device, a graphic control configured to move a movable element between a first position and a second position, and wherein a blocking element coupled to the movable element is configured to:

block propagation of a first protocol of wireless signal and allow propagation of a second protocol of wireless signal at an antenna of the mobile device when the movable element is in the first position; and allow propagation of the first protocol of wireless signal and block propagation of the second protocol of wireless signal at the antenna when the movable element is in the second position;

receive a user interaction for actuating the graphic control via the user display; and in response to actuation of the graphic control, causing the movable element to move between the first position and the second position.

12. The method of claim 11, wherein the first protocol of wireless signal corresponds to a first range of wireless signal frequency, power, or waveform, and wherein the second protocol of wireless signal corresponds to a second range of wireless signal frequency, power, or waveform.

13. The method of claim 11, wherein the movable element comprises software controls executed by at least one processor of the mobile device that can be actuated to configure the blocking element.

14. The method of claim 11, wherein the movable element and the blocking element coupled to the movable element are disposed in a case for the mobile device, and wherein the case is configured to be removable from the mobile device and to physically protect the mobile device when the mobile device is disposed in the case.

15. The method of claim 11, wherein the movable element and blocking element coupled to the movable element are disposed in a case of the mobile device, and wherein the case is integrated in the mobile device and forms a surface of the mobile device.

16. The method of claim 11, wherein the movable element is a physical structure that is rotatable, slidable, or removable between the first position and the second position and comprises: a sliding element, a folding element, a removable element, and/or a rotatable element.

17. The method of claim 11, further comprising:

display a plurality of graphic controls on the user display, wherein each of the plurality of graphic controls is configured to move one of a plurality of movable elements configured to actuate one or more blocking elements to block propagation of different wireless signals.

18. The method of claim 11, wherein the blocking element is configured to be electrically or mechanically configured to move between the first position and second position.

19. The method of claim 11, wherein the mobile device further comprises one or more antennas for receiving or transmitting wireless signals.

20. The method of claim 19, wherein the blocking element is disposed in a case between at least one antenna of the one or more antennas and an exterior environment, and wherein the blocking element is configured to block or unblock propagation of wireless signals to and/or from the at least one antenna of the mobile device.

* * * * *